(12) United States Patent
Yang et al.

(10) Patent No.: US 8,599,348 B2
(45) Date of Patent: Dec. 3, 2013

(54) HIGH LIGHT TRANSMITTANCE IN-PLANE SWITCHING LIQUID CRYSTAL DISPLAY DEVICE AND METHOD FOR MANUFACTURING THE SAME

(75) Inventors: Joon-Young Yang, Gyeonggi-do (KR); Jung-Il Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 274 days.

(21) Appl. No.: 13/069,600

(22) Filed: Mar. 23, 2011

(65) Prior Publication Data

US 2011/0234936 A1    Sep. 29, 2011

(30) Foreign Application Priority Data

Mar. 25, 2010  (KR) ......................... 10-2010-0026909

(51) Int. Cl.
G02F 1/1343    (2006.01)
(52) U.S. Cl.
USPC .......................................... 349/141; 349/139
(58) Field of Classification Search
USPC .......................................................... 349/141
See application file for complete search history.

(56) References Cited

U.S. PATENT DOCUMENTS

| 6,977,706 | B2* | 12/2005 | Wu et al. | 349/141 |
| 7,492,430 | B2* | 2/2009 | Cho et al. | 349/141 |
| 7,932,980 | B2* | 4/2011 | Ge et al. | 349/141 |
| 8,125,609 | B2* | 2/2012 | Ahn | 349/187 |
| 8,212,977 | B2* | 7/2012 | Nam et al. | 349/114 |
| 2003/0043329 | A1* | 3/2003 | Park | 349/141 |
| 2004/0189921 | A1* | 9/2004 | Chen et al. | 349/141 |
| 2004/0212768 | A1* | 10/2004 | Wu et al. | 349/141 |
| 2005/0128413 | A1* | 6/2005 | Son et al. | 349/143 |
| 2005/0200791 | A1* | 9/2005 | Ahn | 349/141 |
| 2006/0077324 | A1* | 4/2006 | Ahn | 349/114 |

(Continued)

FOREIGN PATENT DOCUMENTS

| CN | 1567070 A | 1/2005 |
| CN | 101196664 A | 6/2008 |
| KR | 10-2004-0043484 A | 5/2004 |

OTHER PUBLICATIONS

Chinese Office Action dated Mar. 4, 2013 for corresponding International application No. CN201110077086.4.

(Continued)

*Primary Examiner* — Rhonda Peace
(74) *Attorney, Agent, or Firm* — Morgan, Lewis & Bockius LLP

(57) ABSTRACT

The present disclosure relates to a horizontal electric field type liquid crystal display device having the horizontal electric fields over the pixel electrodes and the common electrodes which are disposed on the same level plane, and a method for manufacturing the same. The horizontal electric field type liquid crystal display device comprising: a substrate; a gate line and a data line crossing each other with a gate insulating layer therebetween, and defining a pixel area on the substrate; a thin film transistor formed where the gate line and the data line is crossing; a pixel electrode contacting the thin film transistor on the gate insulating layer; a common electrode disposed in parallel with the pixel electrode having a predetermined distance; and a passivation layer covering whole surface of the substrate including the pixel electrode and the common electrode. According to the present disclosure, as all liquid crystal molecules including molecules disposed right over the pixel electrodes and the common electrodes are driven by the horizontal electric field, the light transmittance and the aperture ratio are enhanced.

10 Claims, 8 Drawing Sheets

(56) References Cited

U.S. PATENT DOCUMENTS

| | | | |
|---|---|---|---|
| 2006/0250566 A1* | 11/2006 | Kim et al. | 349/164 |
| 2006/0290868 A1* | 12/2006 | Cho et al. | 349/141 |
| 2008/0129901 A1 | 6/2008 | You et al. | |
| 2011/0141421 A1* | 6/2011 | Lee et al. | 349/138 |
| 2011/0234936 A1* | 9/2011 | Yang et al. | 349/46 |

OTHER PUBLICATIONS

Korean Office Action dated Feb. 26, 2013 for corresponding CN Patent application No. 10-2010-0026909.

* cited by examiner

HIGH LIGHT TRANSMITTANCE IN-PLANE SWITCHING LIQUID CRYSTAL DISPLAY DEVICE AND METHOD FOR MANUFACTURING THE SAME

This application claims the benefit of Korea Patent Application No. 10-2010-0026909 filed on Mar. 25, 2010, which is incorporated herein by reference for all purposes as if fully set forth herein.

BACKGROUND OF THE INVENTION

1. Field of the Invention

The present disclosure relates to a high light transmittance in-plane switching liquid crystal display device and a method for manufacturing the same. Especially, the present disclosure relates to a horizontal electric field type liquid crystal display device having the horizontal electric fields over the pixel electrodes and the common electrodes which are disposed on the same level plane, and a method for manufacturing the same.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or ED).

The liquid crystal display device represents video data by controlling the light transmitivity of the liquid crystal layer using the electric fields. According to the direction of the electric field, the LCD can be classified in the two major types; one is vertical electric field type and the other is the horizontal electrid field type.

For the vertical electric field type LCD, the common electrode formed on the upper substrate and the pixel electrode formed on the lower substrate are facing with each other for forming the electric field of which direction is perpendicular to the substrate face. The twisted nematic (TN) liquid crystal layer disposed between the upper substrate and the lower substrate is driven the vertical electric field. The vertical electric field type LCD has merit of higher aperture ratio, while it has demerit of narrower view angle about 90 degree.

For the horizontal electric field type LCD, the commone electrode and the pixel electrode are formed on the same substrate in parallel. The liquid crystal layer disposed between the upper substrate and the lower substrate is driven in In-Plane-Switching (IPS) mode by the electric field parallel to the substrate face. The horizontal electric field type LCD has a merit of wider view angle over 170 degrees and faster response speed than the vertical electric field type LCD.

Hereinafter, we will explain about the horizontal electric field type LCD. FIG. 1 is a plane view illustrating the horizontal electric field type liquid crystal display device according to the related art. FIGS. 2A to 2D are cross-sectional views illustrating the steps of manufacturing the horizontal electric field type liquid crystal display panel of FIG. 1 by cutting along the line I-I' according to the related art.

Referring to FIG. 1 and FIGS. 2A to 2D, the liquid crystal display panel includes a thin film transistor array substrate having a plurality of thin film transistors thereon. The liquid crystal display panel, not shown in the drawings, further includes a color filter substrate facing with the thin film transistor substrate and a liquid crystal layer between the thin film transistor substrate and the color filter substrate. The color filter substrate includes a plurality of color filters and a black matrix.

The thin film transistor substrate of the horizontal electric field type LCD panel comprises a gate line GL and a data line DL crossing each other on a lower substrate SUB, a thin film transistor TFT formed at the crossing portion of the gate line GL and the data line DL, a pixel electrode PXL and a common electrode COM formed within a pixel area defined by the crossing structure of the gate line GL and the data line DL to form a horizontal electric field, and a common line CL connecting to the commone electrode COM.

The thin film transistor TFT includes a gate electrode G branching from the gate line GL, a semiconductor layer A overlapping with the gate electrode G on a gate insulating layer GI covering the gate electrode G, a source electrode S branching from the data line DL and contacting one side of the semiconductor layer A, and a drain electrode D facing with the source electrode and contacting the other side of the semiconductor layer A. On the thin film transistor TFT, a passivation layer PASSI is formed to cover and protect the thin film transistor TFT. On the passivation layer PASSI, the pixel electrode PXL and the common electrode COM are formed.

The gate line GL supplies the gate signal to the gate electrode G. The data line DL supplies the pixel signal to the pixel electrode PXL through the drain electrode D of the thin film transistor TFT. The gate line GL and the data line DL are formed in the crossing structure to define the pixel area. The common line CL is formed to be parallel to the gate line GL with the pixel area between the gate line GL, and supplies the reference voltage signal for driving the liquid crystal layer to the common electrode PXL.

The thin film transistor TFT charges and maintains the pixel signal voltage to the pixel electrode PXL by responding to the gate signal of the gate line GL. The pixel electrode PXL is formed within the pixel area to be connected to the drain electrode D of the thin film transistor TFT exposed via a drain contact hole CHD formed through the passivation layer PASSI. The common electrode COM is formed within the pixel area to be connected to the common line CL via a common contact hole CHCOM formed through the passivation layer PASSI and the gate insulating layer GI. Especially, the pixel electrode PXL and the common electrode COM are disposed in parallel with each other within the pixel area. For example, the common electrode COM has a plurality of vertical segments which are separatedly disposed with a predetermined distance each other. The pixel electrode PXL has a plurality of vertical segments in which each segments is disposed between the segments of the common electrode COM.

Therefore, the horizontal electric field is formed between the pixel electrode PXL supplied with the pixel signal voltage through the thin film transistor TFT and the commone electrode COM supplied with the reference signal voltage through the common line CL. Due to this horizontal electric field, the liquid crystal molecules of the liquid crystal layer disposed between the thin film transistor array substrate and the color filter substrate are rotated by the dielectric anisotropy. According to the rotating amount, the light transmittance of the pixel area is differed, and then the video image can be represented.

Referring to FIG. 1 and FIGS. 2A to 2D, the processing of manufacturing the horizontal electric field type liquid crystal display panel will be explained. This manufacturing process has four mask-processes which are mostly stabilized processing method in current technology.

A gate metal is deposited on a substrate SUB. The gate elements are formed by patterning the gate metal using the first mask process. As shown in FIG. 2A, the gae elements include the gate line GL, the gate electrode G branching from the gate line GL, a gate pad GP formed at one end of the gate line GL, and the common line CL disposed in parallel to the gate line GL.

A gate insulating layer GI is deposited on the whole surface of the substrate SUB having the gate elements. After that, a semiconductor material and a source-drain metal are sequentially deposited thereon. By patterning the semiconductor material and the source-drain metal using the second mask process, the source-drain elements are formed. As shown in FIG. 2B, the source-drain elements include the data line DL crossing with the gate line GL, a data pad DP formed at one end of the data line DL, the source electrode S branching from the data line DL and overlapping with one side of the gate electrode G, and the drain electrode D facing with the source electrode S and overlapping with the other side of the gae electrode G. Especially, the source electrode S and the drain electrode D are physically separated eath other, but they are connected via the semiconductor layer A formed on the gate insulating layer GI and overlapping with the gate electrode G under the source electrode S and the drain electrode D. The source-drain metal between the source electrode S and the drain electrode D are removed, but the semiconductor layer under the removed source-drain metal should be remained. Therefore, it is preferable to use the half-tone mask. That is, the semiconductor material is remained under the source-drain elements, and it does not work. The semiconductor material between the source electrode S and the drain electrode D just plays role as a semiconductor channel layer A. In the interim, as shown in FIG. 1, the drain electrode D can be formed as to be overlapped with the common line CL. In this case, the overlapped portion with the drain electrode D can play role as a storage capacitance Cst.

On the whole surface of the substrate SUB having the source-drain elements, the passivation layer PASSI is deposited. As shown in FIG. 2C, by patterning the passivation layer PASSI using the third mask process, the drain contact hole CHD exposing some portions of the drain electrode D and a data pad contact hole CHDP exposing some portions of the data pad DP are formed. At the same time, by patterning the passivation layer PASSI and the gate insulating layer GI, a gate pad contact hole CHGP exposing some portions of the gate pad GP is formed. Furthermore, not shown in the cross sectional views, the common contact hole CHCOM exposing some portions of the common line CL is formed.

On the passivation layer PASSI having the contact holes CHGP, CHD, CHDP and CHCOM, a transparent conductive material such as ITO (Indium Tin Oxide) is deposited. By patterning the transparent conductive material using the fourth mask process, the pixel electrode PXL and the common electrode COM are formed within the pixel area. At the same time, a gate pad terminal GPT contacting the gate pad GP through the gate pad contact hole CHGP, and a data pad terminal DPT contacting the data pad DP through the data pad contact hole CHDP are formed. The pixel electrode PXL contacts the drain electrode D through the drain contact hole CHD. The common electrode COM contact the common line CL through the common contact hole CHCOM. The pixel electrode PXL and the common electrode COM are disposed in parallel each other with a predetermined distance, as shown in FIG. 2D.

After that, even not shown in drawings, the thin film transistor array substrate having the pixel electrode PXL and the common electrode COM will be transferred to the chamber for forming the alignment layer. And then, the thin film transistor array substrate is joined with the color filter array layer by having the liquid crystal layer therebetween to complete the liquid crystal display panel.

In the horizontal electric field type liquid crystal display panel mentioned above, the formation of the horizontal electric field for driving the liquid crystal layer will be explained in detail. FIG. 3 is the cross-sectional view illustrating the formation of the horizontal electric field for driving the liquid crystal molecules formed between the pixel electrode and the common electrode in the horizontal electric field type liquid crystal display panel according to the related art, by cutting along the line II-II' in FIG. 1.

Referring to FIG. 2, the pixel electrode PXL and the common electrode COM are disposed in parallel at the same leveled plane. When there is a DC voltage difference between the pixel electrode PXL and the common electrode COM, the horizontal electric field is formed as the solid curve as shown in FIG. 3. As above explained, the pixel electrode PXL and the common electrode COM have the rectangular segment shape. The pixel electrode PXL and the common electrode COM are disposed in facing with a predetermined distance.

In the horizontal electric field type liquid crystal display panel currently used in most, as shown in FIG. 3, the pixel electrode PXL and the common electrode COM are the segment shape having about 4 um (micro-meter) line width. The pixel electrode PXL and the common electrode COM are separated each other with about 10~12 um distance which is about 2.5~3 times of the line width. In addition, on the pixel electrode PXL and the common electrode COM, the alignment layer ALG defining the initial alignment direction of the liquid crystal molecules LCM of the liquid crystal layer is deposited.

When the electric field is formed between the pixel electrode PXL and the common electrode COM, the liquid crystal molecules LCM are rearranged along the direction of the electric field. Under this condition, the horizontal electric field is formed within the space between the closest sides of the pixel electrode PXL and the common electrode COM. However, right over the pixel electrode PXL and the common electrode COM, there is no horizontal electric field but almost vertical electric field.

Under this condition, as shown in FIG. 3, most of liquid crystal molecules LCM disposed right over the pixel electrode PXL and the common electrode COM are not rearranged by the electric field but maintained in the initial alignment direction. That is, the liquid crystal molecules LCM disposed between the pixel electrode PXL and the common electrode COM are driven by the horizontal electric field to contribute to the variation of the light transmittance. However, the liquid crystal molecules LCM right over the pixel electrode PXL and the common electrode COM are not driven by the horizontal electric field so they do not contribute to the variation of the light transmittance. Therefore, the areas occupied by the pixel electrode PXL and the common electrode COM are the non-display area NDA, and the areas of the space between the pixel electrode PXL and the common electrode COM are the display area DA only.

In the vertical electric field type, the whole overlapped areas of the pixel electrode PXL and the common electrode COM in the pixel area contribute to the aperture ratio and the brightness directly. However, in the horizontal electric field type, the areas of the pixel electrode PXL and the common electrode COM do not contribute to the aperture ratio and the brightness directly. Even though the pixel electrode PXL and the common electrode COM are made of transparent material, they reduce the aperture ratio and the brightness.

SUMMARY OF THE INVENTION

In order to overcome the above mentioned drawbacks, the purpose of the present disclosure is to suggest a high light transmittance in-plane switching liquid crystal display device and a method for manufacturing the same in which the portions of the liquid crystal molecules driven by the horizontal electric field is increased. Another purpose of the present disclosure is to suggest a high light transmittance in-plane switching liquid crystal display device and a manufacturing method of the same in which the liquid crystal molecules disposed right over the pixel electrode and the common electrode are driven by the horizontal electric field. Still another purpose of the present disclosure is to suggest a high light transmittance in-plane switching liquid crystal display device and a manufacturing method of the same in which the horizontal electric field is formed over the pixel electrode and the common electrode disposed in the same leveled plane.

In order to accomplish the above purpose, the present disclosure suggests a horizontal electric field type liquid crystal display device comprising: a substrate; a gate line and a data line crossing each other with a gate insulating layer therebetween, and defining a pixel area on the substrate; a thin film transistor formed where the gate line and the data line is crossing; a pixel electrode contacting the thin film transistor on the gate insulating layer; a common electrode disposed in parallel with the pixel electrode having a predetermined distance; and a passivation layer covering whole surface of the substrate including the pixel electrode and the common electrode.

The predetermined distance between the pixel electrode and the common electrode is 0.5~1.5 times of at least one width of the pixel electrode and the common electrode.

The device further comprises, a gate pad formed at one end of the gate line; a data pad formed at one end of the data line; a data pad contact hole exposing some portions of the data pad through the passivation layer; a gate pad contact hole exposing some portions of the gate pad through the passivation layer and the gate insulating layer; a data pad terminal filling in the data pad contact hole and contacting the data pad; and a gate pad terminal filling in the gate pad contact hole and contacting the gate pad.

The device further comprises, a common line disposed in parallel with the gate line on the same leveled plane; a common contact hole exposing some portions of the common electrode through the passivation layer, and exposing some portions of the common line through the passivation layer and the gate insulating layer; and a common connecting terminal filling in the common contact hole, and connecting the common electrode and the common line.

The thin film transistor comprises, a gate electrode branching from the gate line; a semiconductor layer overlapping with the gate electrode on the gate insulating layer covering the gate line and the gate electrode; a source electrode formed on the gate insulating layer, branching from the data line and contacting one side of the semiconductor layer; and a drain electrode contacting the other side of the semiconductor layer, and facing with the source electrode.

A manufacturing method of a high light transmittance in-plane switching liquid crystal display device comprising: a first mask process for forming gate elements by depositing and patterning a gate metal on a substrate; a second mask process for completing a thin film transistor by depositing a gate insulating layer, a semiconductor material and a source-drain metal sequentially, and by patterning the semiconductor material and the source-drain metal to form source-drain elements; a third mask process for forming a pixel electrode connecting the thin film transistor and a commone electrode disposed in parallel with the pixel electrode having a predetermined distance by depositing and patterning a transparent conductive material on the gate insulating layer; and a fourth mask process for forming a gate contact hole exposing some portions of the gate elements and a data contact hole exposing some portions of the source-drain elements by depositing and patterning a passivation layer on the whole surface of the substrate having the pixel electrode and the common electrode, and for forming a gate terminal and a data terminal filling in the gate contact hole and the data contact hole, respectively.

The fourth mask process comprises, depositing and patterning a photo-resist on the passivation layer; forming the gate contact hole and the data contact hole using the patterned photo-resist; depositing a conductive material on the whole surface of the substrate having the patterned photo-resist, the gate contact hole and the data contact hole; and forming a gate terminal and the data terminal by removing the patterned photo-resist, for selectively removing the conductive material disposed on the photo-resist and for remaining the conductive material filling within the gate contact hole and the data contact hole.

The gate elements in the first mask process comprises: a gate line; a gate electrode branching from the gate line; a gate pad formed at one end of the gate line; and a common line disposed in parallel with the gate line, and wherein the gate contact hole in the fourth mask process comprises: a gate pad contact hole exposing some portions of the gate pad through the passivation layer and the gate insulating layer; and a common contact hole exposing some portions of the common line through the passivation layer and the gate insulating layer, and exposing some portions of the common electrode through the passivation layer.

The gate terminal in the fourth mask process comprises: a gate pad terminal filling in the gate pad contact hole and contacting the gate pad; and a common connecting terminal filling in the common contact hole and connecting some portions of the common line with some portions of the common electrode.

The source-drain elements in the second mask process comprises: a data line crossing the gate line having the gate insulating layer therebetween; a data pad formed one end of the data line; a source electrode branching from the data line and overlapping with one side of the gate electrode; and a drain electrode overlapping with the other side of the gate electrode and facing with the source electrode, wherein the thin film transistor overlaps with the gate electrode on the gate insulating layer, and comprises a semiconductor layer connecting the source electrode and the drain electrode, and wherein the data contact hole in the fourth mask process comprises a data pad contact hole exposing some portions of the data pad through the passivation layer.

The data terminal in the fourth mask process comprises a data pad terminal filling in the data pad contact hole and connecting the data pad.

In the liquid crystal display device according to the present disclosure, as all liquid crystal molecules including molecules disposed right over the pixel electrodes and the common electrodes are driven by the horizontal electric field, the light transmittance and the aperture ratio are enhanced. Furthermore, according to the present disclosure, it is possible to manufacture the liquid crystal display panel in which the structure is optimized and the manufacturing cost is reduced by simplifying the optical film structure.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 4:
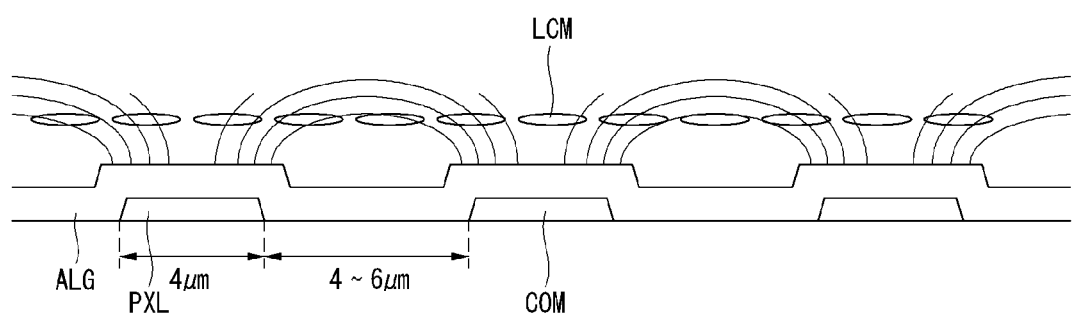
FIG. 4 is a cross-sectional view illustrating the formation of the horizontal electric field for driving the liquid crystal molecules formed between the pixel electrode and the common electrode in the horizontal electric field type liquid crystal display panel according to the first embodiment of the present disclosure.

Referring to attached figures including FIGS. 4 to 7E, we will explain preferred embodiments of the present disclosure. FIG. 4 is a cross-sectional view illustrating the formation of the horizontal electric field for driving the liquid crystal molecules formed between the pixel electrode and the common electrode in the horizontal electric field type liquid crystal display panel according to the first embodiment of the present disclosure. FIGS. 5a and 5b are cross-sectional views illustrating the manufacturing steps of the horizontal electric field type liquid crystal display panels according to the second embodiment of the present disclosure.

In the present disclosure, it is important to configure all contour lines of the electric field between the pixel electrode and the common electrode to have horizontal components. To do this, the pixel electrode PXL and the common electrode COM are preferably disposed having narrower distance than in the case of the related art. That is, the manufacturing method for the thin film transistor array substrate according to the first embodiment of the present disclosure can include the same steps of the manufacturing method according to the related art. However, when forming the pixel electrode PXL and the common electrode COM, it is preferable to dispose the pixel electrode PXL and the common electrode COM to have closer distance than the related art. Referring to FIG. 4, the pixel electrode PXL and the common electrode COM are disposed with the distance of 0.5~1.5 times of their widths. For example, when the pixel electrode PXL and the common electrode COM have 4 um width, the pixel electrode PXL and the common electrode COM can be disposed having one selected distance among 2~6 um.

In this case, as shown in FIG. 4, all electric field contour lines formed between the pixel electrode PXL and the common line COM contribute to form a horizontal electric field. Only on the extremely small middle portions of the pixel electrode PXL and the common electrode COM, there may be the vertical components of the weak electric field. Therefore, in the horizontal electric field type liquid crystal display panel according to the present disclosure, all molecules of the liquid crystal material are driven by the horizontal electric field. That is, the liquid crystal molecules disposes over the pixel electrode PXL and the common electrode COM which are not driven because they are not affected by the horizontal electric field in the related art can be driven by the horizontal electric field according to the present disclosure. Therefore, the present disclosure suggests the liquid crystal display device having enhanced light transmittance.

However, in the first embodiment of the present disclosure, there may be another problem. As the pixel electrode PXL and the common electrode COM are disposed having the distance same with their width, they may be damaged by foreign materials accidentally disposed thereon. Especially, when the conductive foreign materials are disposed thereon, the pixel electrode PXL and the common electrode COM may be electrically connected so that the horizontal electric field cannot be formed.

As explained above, after the pixel electrode PXL and the common electrode COM are formed, the thin film transistor array substrate is transferred to the chamber for depositing an alignment layer. In this process, the thin film transistor is exposed under the condition of contamination by the foreign materials, especially electrically conductive foreign materials. Therefore, it is preferable to conduct the alignment layer depositing process sequentially under the manufacturing process for the thin film transistor array. It is hard to do this because the depositing process has the totally different conditions from the manufacturing process for the thin film transistor array.

Figure 5A:
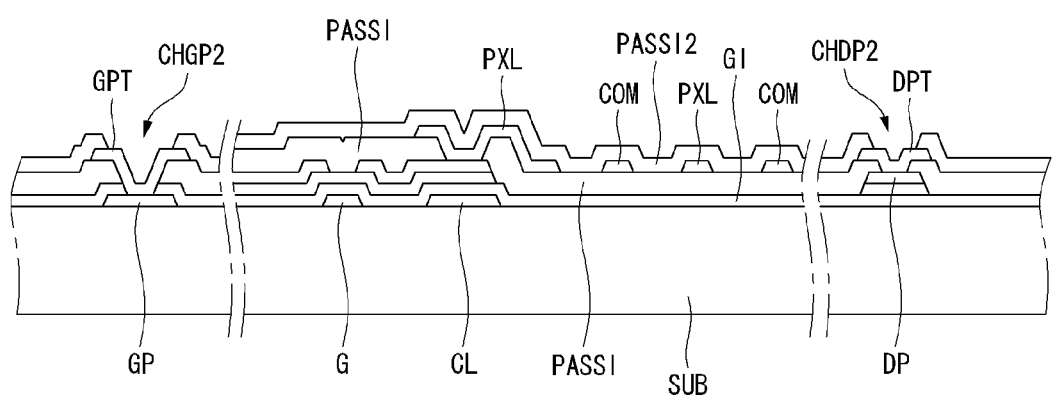
FIGS. 5a and 5b are cross-sectional views illustrating the manufacturing steps of the horizontal electric field type liquid crystal display panels according to the second embodiment of the present disclosure.
Figure 5B:
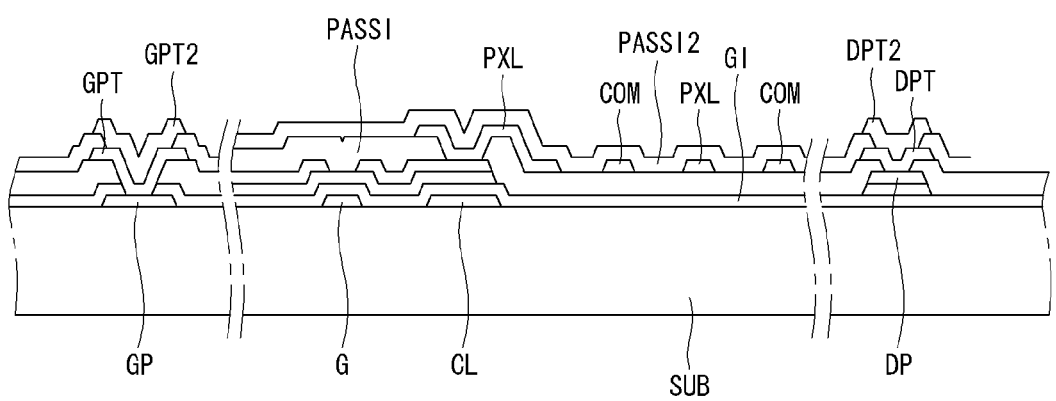

To overcome these problems, according to the second embodiment of the present disclosure, a second protection layer is further formed after the pixel electrode and the common electrode. FIGS. 5a and 5b are cross-sectional views illustrating the manufacturing steps of the horizontal electric field type liquid crystal display panels according to the second embodiment of the present disclosure.

By the same method as the first embodiment of the present disclosure, the thin film transistor substrate having the pixel electrode PXL and the common electrode COM is manufactured. As explained above, the steps for manufacturing the thin film transistor substrate is the same with the manufacturing method according to the related art. That is, with the same steps as shown in FIGS. 2A to 2D, the pixel electrode PXL, the common electrode COM, the gate pad terminal GPT, and the data pad terminal DPT are formed on the substrate SUB.

On the whole surface of the substrate SUB having the pixel electrode PXL, the common electrode COM, the gate pad terminal GPT, and the data pad terminal DPT, a second passivation layer PASSI2 is deposited. The pixel electrode PXL and the common electrode COM may have no problems even thay are covered by the second passivation layer PASSI2. However, the gate pad terminal GPT and the data pad terminal DPT should be exposed because they are provided the electric signal from external elements. Therefore, by patterning the second passivation layer PASSI2 using the fifth mask process, a second gate pad contact hole CHGP2 for exposing the gate pad terminal GPT and a data pad contact hole CHDP2 for exposing the dat pad terminal DPT are formed, as shown in FIG. 5A.

On the second passivation layer PASSI2 having the second contact holes CHGP2 and CHDP2, a transparent conductive material such as indium tin oxide (ITO) is deposited. By patterning the transparent conductive layer using the sixth mask process, a second gate pad terminal GPT2 contacting the gate pad terminal GPT through the second gate pad contact hole CHGP2, and a second data pad terminal DPT2 contacting the data pad terminal DPT through the second data pad contact hole CHDP2 are formed, as shown in FIG. 5B.

The horizontal electric field type liquid crystal display panel according to the second embodiment of the present disclosure can form the horizontal electric field contour over the pixel electrode PXL and the common electrode COM. Furthermore, as the pixel electrode PXL and the common electrode COM are covered by the second passivation layer PASSI2, it is possible to prevent them from being damaged by the foreign materials during the manufacturing processes.

However, as shown above, the second embodiment needs to have two additional mask processes. With these additional mask processes, the manufacturing tack time should be increased and the manufacturing cost should be expensive. Therefore, the second embodiment of the present disclosure has demerit to apply the actual manufacturing process.

Figure 6:
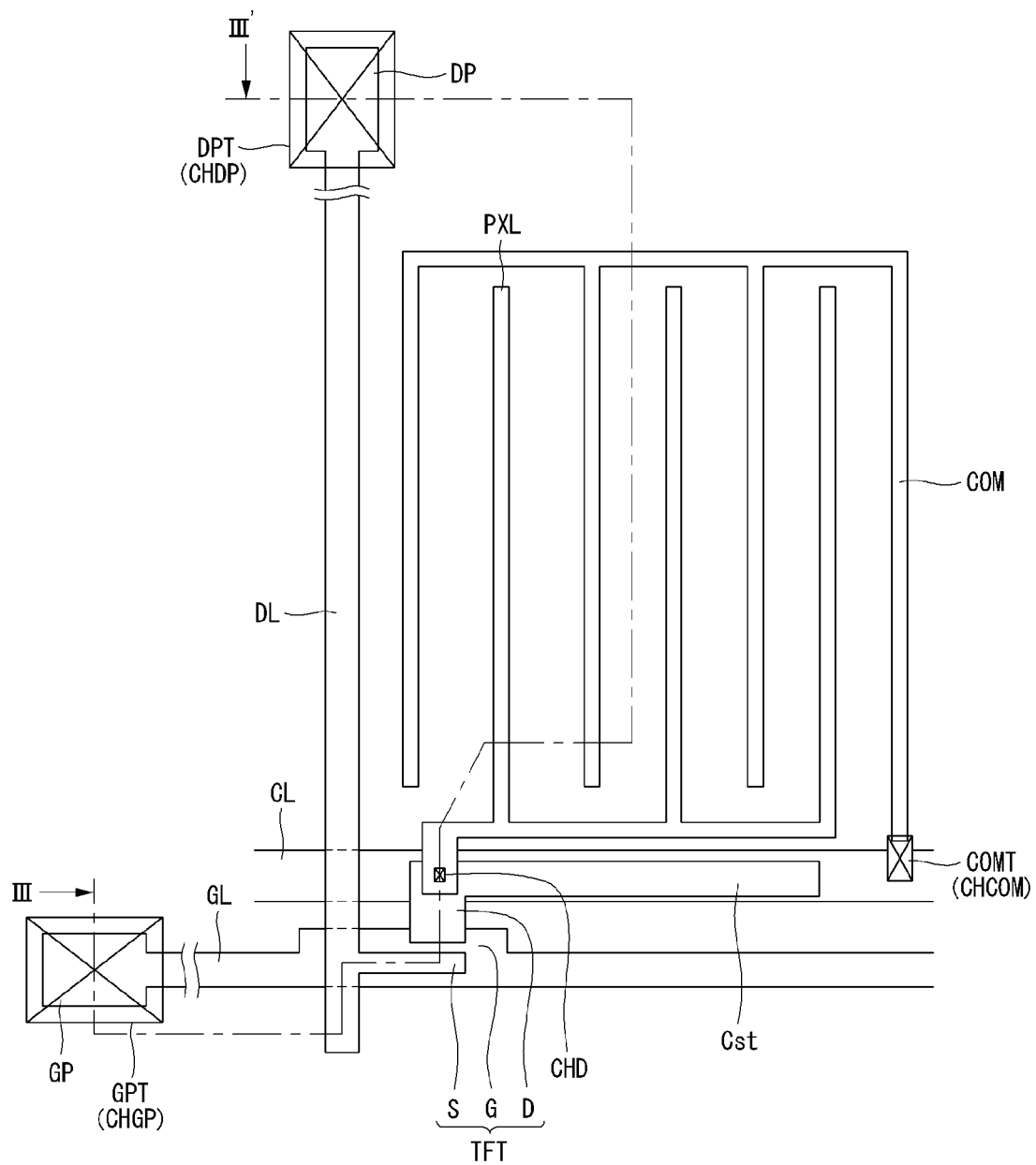
FIG. 6 is a plane view illustrating the structure of the horizontal electric field liquid crystal display panel according to the third embodiment of the present disclosure.

To overcome these problems and demerits, the third embodiment of the present disclosure suggests a method for manufacturing the thin film transistor array substrator having the pixel electrode and the common electrode closely disposed with 4 mask processes, and the horizontal electric field type liquid crystal display panel thereby. FIG. 6 is a plane view illustrating the structure of the horizontal electric field liquid crystal display panel according to the third embodiment of the present disclosure. FIGS. 7A to 7E are cross-sectional views illustrating the steps of manufacturing the horizontal electric field type liquid crystal display panel of FIG. 6 by cutting along the line III-III' according to the third embodiment of the present disclosure.

Figure 7A:
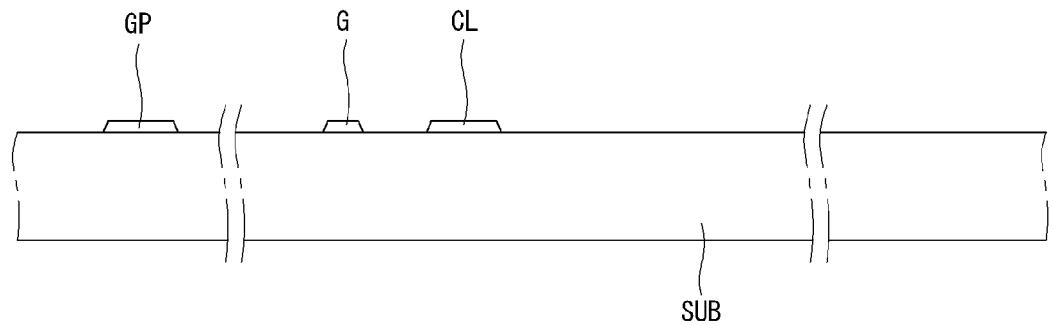
FIGS. 7A to 7E are cross-sectional views illustrating the steps of manufacturing the horizontal electric field type liquid crystal display panel of FIG. 6 by cutting along the line III-III' according to the third embodiment of the present disclosure.

At first, referring to the FIG. 7A to 7E, the method for manufacturing the thin film transistor array substrate will be explained. On the substrate SUB, a gate metal is deposited. By patterning the gate metal using the first mask process, the gate elements are formed. The gate elements include a gate line GL, a gate electrode G branching from the gate line GL, a gate pad GP formed one end of the gate line GL, and a common line CL disposed in parallel with the gate line GL, as shown in FIG. 7A.

Figure 7B:
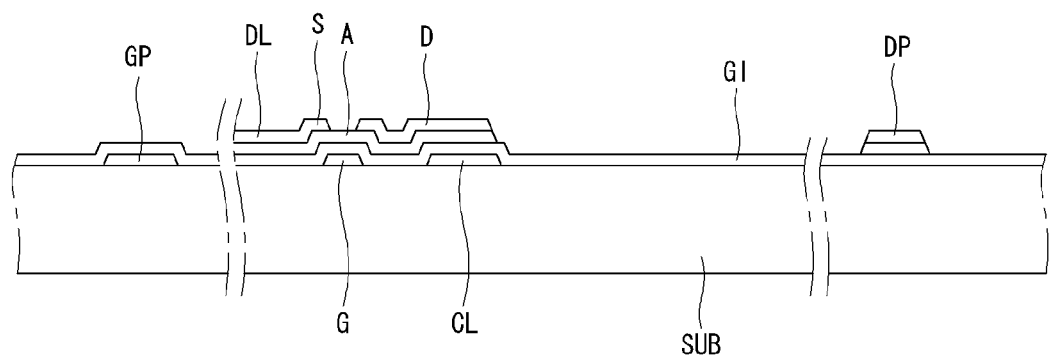

On the whole surface of the substrate SUB having the gate elements, a gate insulating layer GI is deposited. After that, a semiconductor material and a source-drain metal are sequentially deposited on the gate insulating layer GI. By patterning the semiconductor material and the source-drain metal using a second mask process, source-drain elements are formed, as shown in FIG. 7B. The source-drain elements include a data line DL crossing with the gate line GL on the gate insulating layer GI, a data pad DP formed one end of the data line DL, a source electrode S branching from the data line DL and overlapping with one side of the gate electrode G, and a drain electrode D facing with the source electrode S and overlapping with the other side of the gate electrode G. Especially, the source electrode S and the drain electrode D are physically separated from each other, but they are electrically connected through the semiconductor channel layer A overlapping with the gate electrode G on the gate insulating layer GI. The source-drain metal between the source electrode S and the drain electrode D should be removed, but the semiconductor between them should be remained, so it is preferable to use a half-tone mask. After that, the semiconductor material is also remained under the source electrode S and the drain electrode D, but it is not works specially. Only the semiconductor material between the source electrode S and the drain electrode D works as the semiconductor channel layer A.

Figure 7C:
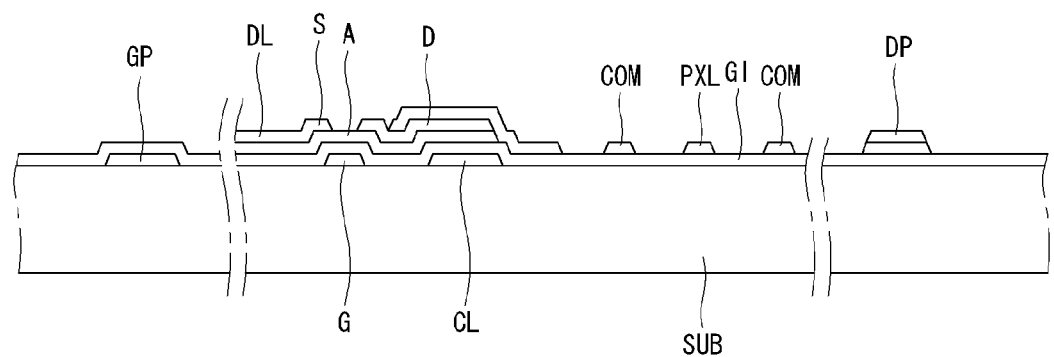
Figure 7D:
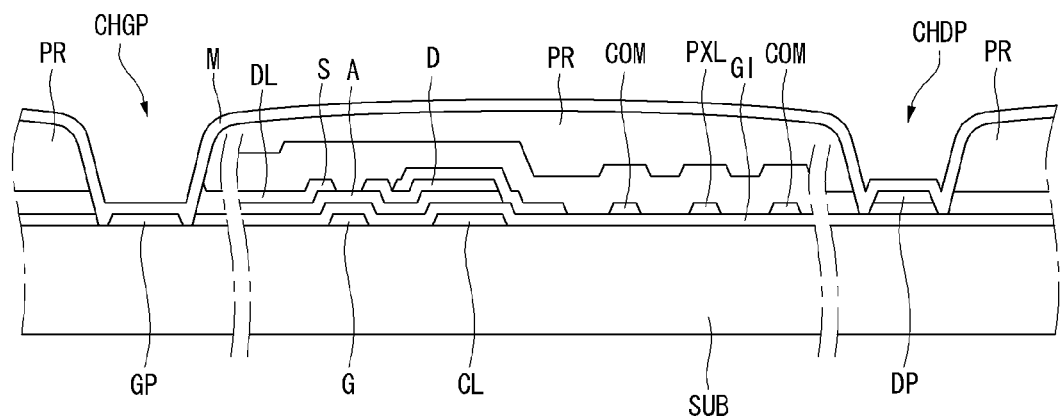
Figure 7E:
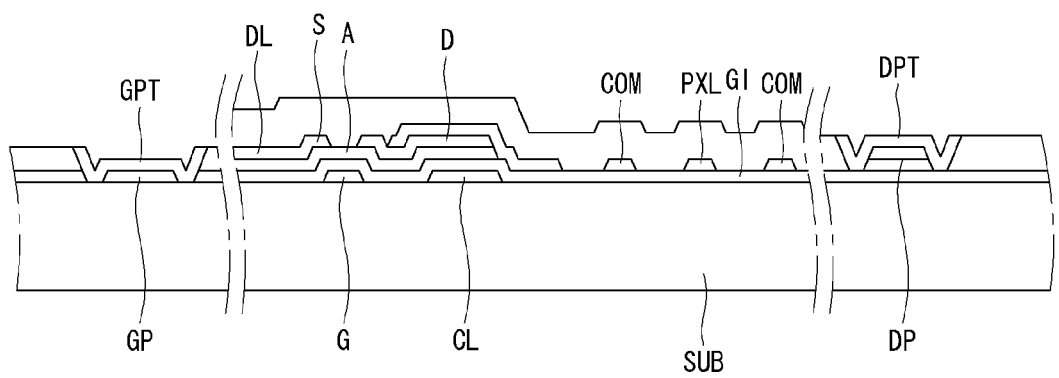

On the whole surface of the substrate SUB having the source-drain elements, a transparent conductive material such as indium tin oxide (ITO) is deposited. By patterning the transparent conductive material using a third mask process, a pixel electrode PXL and a common electrode COM are formed within the pixel area on the gate insulating layer GI. The pixel electrode PXL may cover some portions of the drain electrode D. The pixel electrode PXL and the common electrode COM are disposed in parallel with each other having a predetermined distance. Especially, they are disposed having a distance of 0.5~1.5 times of the width of pixel electrode PXL or the common electrode COM, as shown in FIG. 7C.

On the whole surface of the substrate SUB having the pixel electrode PXL and the common electrode COM, a passivation layer PASSI is deposited. By patterning the passivation layer PASSI using a fourth mask process, contact holes for exposing the pads, and at the same time, pad terminals contacting the pads through the contact holes are formed. The detail manufacturing method will be explained hereinafter.

A photo-resist PR is deposited on the passivation layer PASSI. The photo-resist PR is patterned by a fourth mask for forming a gate pad contact hole CHGP and a data pad contact hole CHDP. Etching the passivation layer PASSI according to the pattern of the photo-resist PR, the data pad contact hole CHDP exposing the whole portions or some portions of the data pad DP is formed. And then, by sequentially etching the passivation layer PASSI and the gate insulating layer GI, the gate pad contact hole CHGP exposing the whole portions or some portions of the gate pad GP is formed. Even though not shown in cross-sectional views, a common contact hole CHCOM exposing some portions of the common line CL through the passivation layer PASSI and the gate insulating layer GI and some portions of the common electrode COM through the passivation layer PASSI may be further formed by etching the passivation layer PASSI and the gate insulating layer GI. After that, without stripping off the photo-resist PR, a conductive material M such as indium tin oxide (ITO) or metal is deposited on the whole surface of the substrate SUB, as shown in the FIG. 7D.

With the conductive material M covering the surface of the photo-resist PR and filling in the gate pad contact hole CHGP and the data pad contact hole CHGP, the photo-resist PR is removed by lifting-off process. Then, the conductive material M covering the photo-resist PR will be also removed with the photo-resist PR. In the interim, the conductive material M filling within the gate pad contact hole CHGP and the data pad contact hole CHDP will be a gate pad terminal GPT contacting the gate pad GP and a data pad terminal DPT contact the dat pad DP, respectively, as shown in the FIG. 7E. Even though not shown in cross-sectional views, the common contact hole CHCOM exposing some portions of the common line CL and the common electrode COM is filled with the conductive material M. Therefore, a common connection terminal COMT connecting the common electrode COM with the common line CL can be formed.

According to the third embodiment of the present disclosure, with four-mask processes, it is possible to manufacture a thin film transistor substrate on which the pixel electrode PXL and the common electrode COM are disposed closer than related art enough to form a horizontal electric field over the pixel electrode PXL and the common electrode COM themself. Furthermore, as the pixel electrode PXL and the common electrode COM are formed between the gate insulating layer GI and the passivation layer PASSI, there is no foreign material causing electric short problem between the pixel electrode PXL and the common electrode COM during manufacturing the thin film transistor array substrate.

In addition, referring to FIG. 6, the structural characteristics of the horizontal electric field type liquid crystal display panel according to the third embodiment of the present disclosure will be explained. The horizontal electric field type liquid crystal display panel according to the third embodiment of the present disclosure comprises a substrate SUB, a gate line GL and a data line DL crossing each other with having a gate insulating layer GI therebetween and defining a pixel area, a thin film transistor TFT formed where the gate line GL and the data line DL are crossing, a pixel electrode PXL electrically connected to the thin film transistor TFT and formed on the gate insulating layer GI, and a common electrode COM disposed in parallel with the pixel electrode PXL having a predetermined distance, and a passivation layer PASSI covering the substrate SUB having the pixel electrode PXL and the commone electrode COM.

That is, the drain electrode D and the pixel electrode PXL are formed as the pixel electrode PXL covers the drain electrode D on the gate insulating layer GI. The common electrode COM and the common line CL are connected by the common connecting terminal COMT filling the common contact hole CHCOM exposing some portions of the common electrode COM and the common line CL at the same time.

Furthermore, the pad terminals including the gate pad terminal GPT and the data pad terminal DPT exposed on the passivation layer PASSI fill with the contact holes CHGP and CHDP, and totally cover the gate pad GP and the data pad DP exposed through the contact holes CHGP and CHDP, respectively. Therefore, in the plane view, each of the gate pad terminal GPT and the data pad terminal DPT has the same size and shape with each contact holes CHGP and CHDP, respectively.

Figure 1:
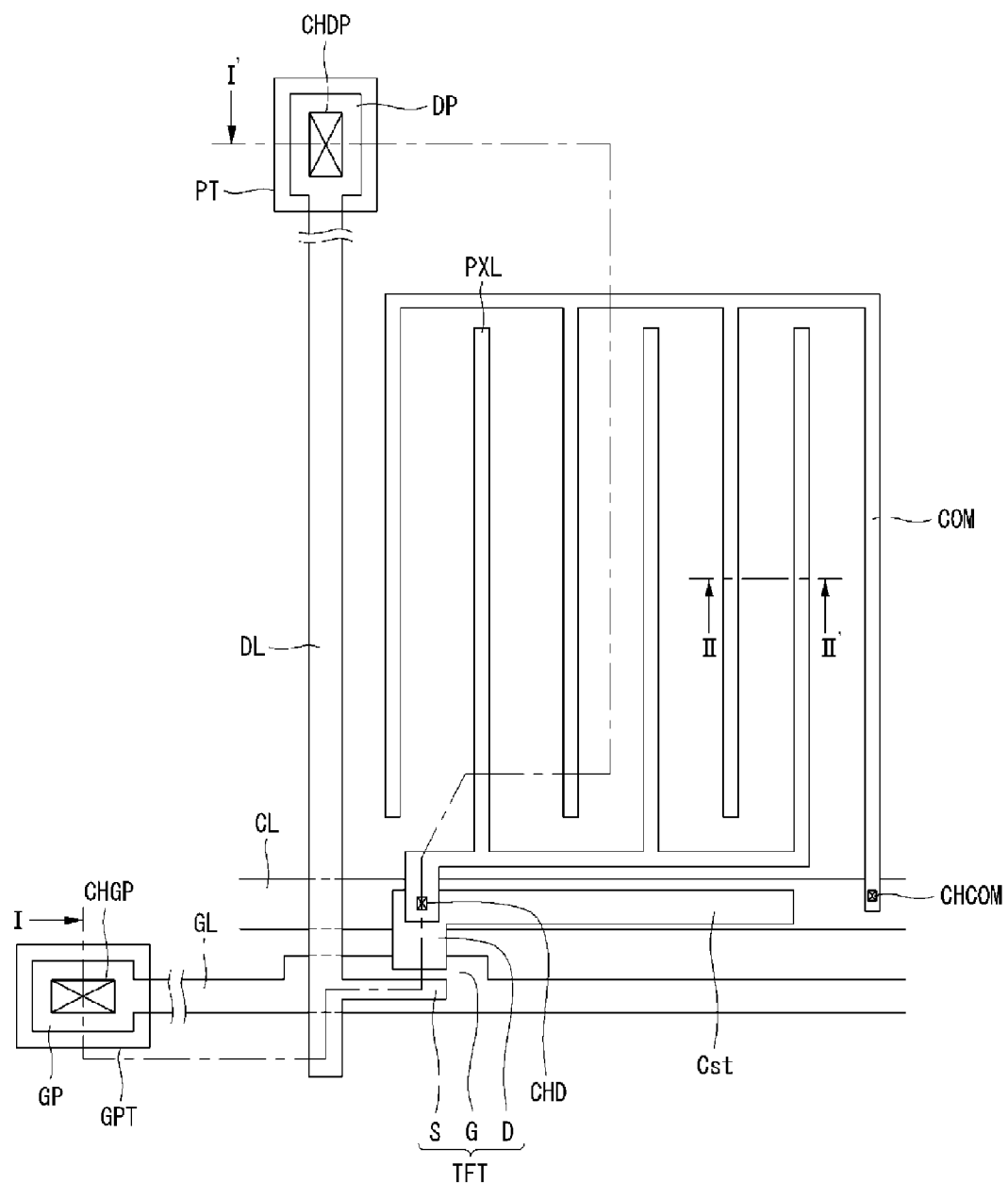
FIG. 1 is a plane view illustrating the horizontal electric field type liquid crystal display device according to the related art.
Figure 2A:
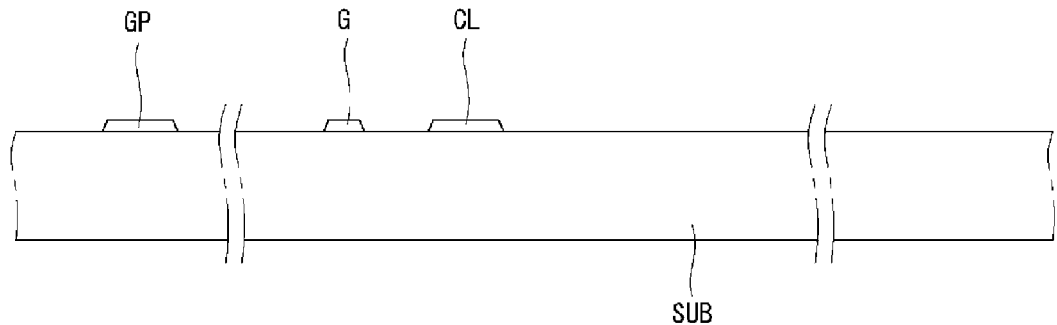
FIGS. 2A to 2D are cross-sectional views illustrating the steps of manufacturing the horizontal electric field type liquid crystal display panel of FIG. 1 by cutting along the line I-I' according to the related art.
Figure 2B:
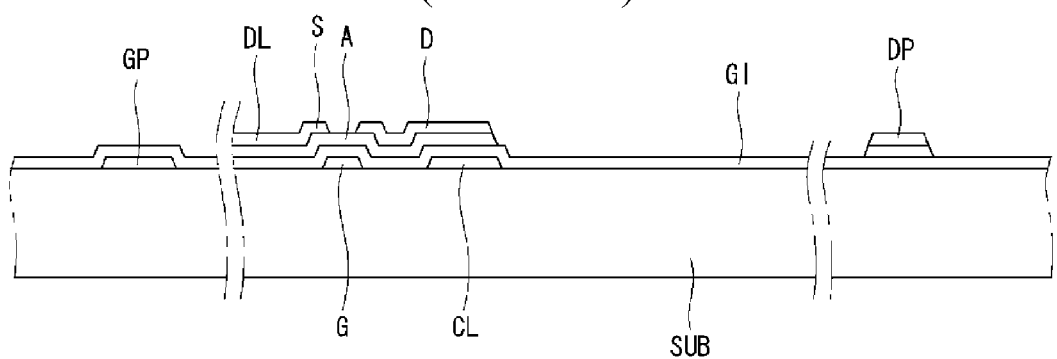
Figure 2C:
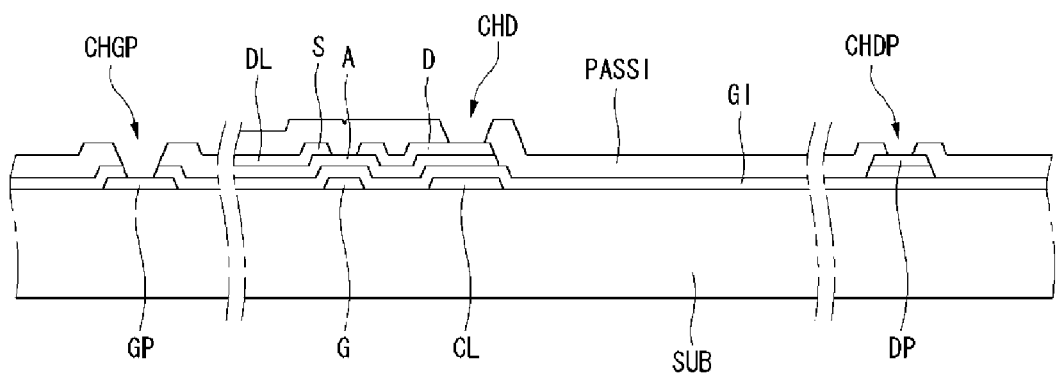
Figure 2D:
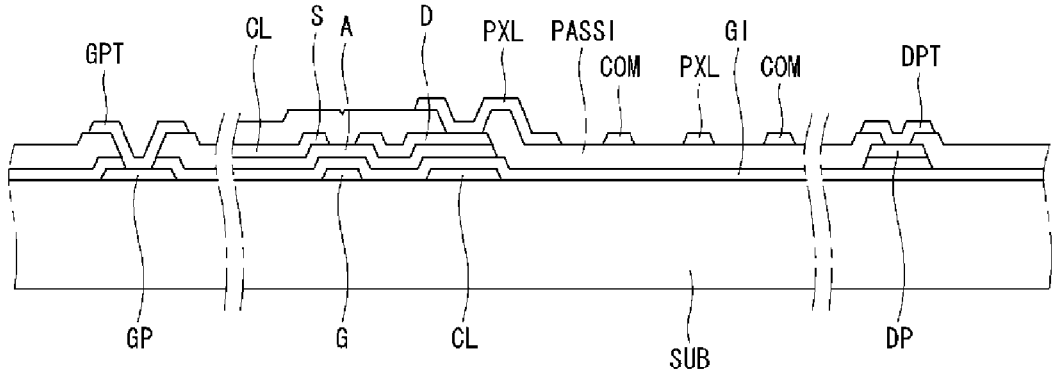
Figure 3:
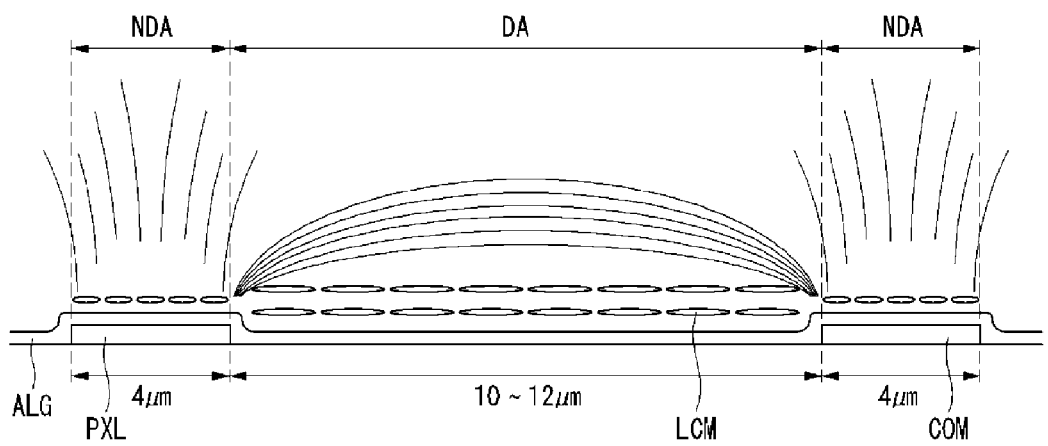
FIG. 3 is the cross-sectional view illustrating the formation of the horizontal electric field for driving the liquid crystal molecules formed between the pixel electrode and the common electrode in the horizontal electric field type liquid crystal display panel according to the related art, by cutting along the line II-II' in FIG. 1.

Even though, in the plane view FIG. 6, the distance between the pixel electrode PXL and the common electrode COM may not shown as to be closer than related art FIG. 1, this is caused by drawing convenience. Actually, the distance between the pixel electrode PXL and the common electrode COM is much closer than that shown in FIG. 1. Especially, the pixel electrode PXL and the common electrode COM are disposed with a distance of 0.5~1.5 times of the width of the pixel electrode PXL or the common electrode COM.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A horizontal electric field type liquid crystal display device, comprising:
    a substrate;
    a gate line and a data line crossing each other with a gate insulating layer therebetween, and defining a pixel area on the substrate;
    a gate pad formed at one end of the gate line;
    a data pad formed at one end of the data line;
    a thin film transistor formed where the gate line and the data line is crossing;
    a pixel electrode contacting the thin film transistor on the gate insulating layer;
    a common electrode disposed in parallel with the pixel electrode having a predetermined distance;
    a passivation layer covering whole surface of the substrate including the pixel electrode and the common electrode;
    a data pad contact hole exposing some portions of the data pad through the passivation layer;
    a gate pad contact hole exposing some portions of the gate pad through the passivation layer and the gate insulating layer;
    a data pad terminal filling in the data pad contact hole and contacting the data pad; and
    a gate pad terminal filling in the gate pad contact hole and contacting the gate pad,
    wherein the predetermined distance between the pixel electrode and the common electrode is 0.5~1.5 times of at least one width of the pixel electrode and the common electrode, such that the horizontal electric field is formed between the pixel electrode and the common electrode and over the pixel electrode and the common electrode.

2. The device according to the claim 1, further comprising:
    a common line disposed in parallel with the gate line on the same leveled plane;
    a common contact hole exposing some portions of the common electrode through the passivation layer, and exposing some portions of the common line through the passivation layer and the gate insulating layer; and
    a common connecting terminal filling in the common contact hole, and connecting the common electrode and the common line.

3. The device according to the claim II, wherein the thin film transistor comprises:
    a gate electrode branching from the gate line;
    a semiconductor layer overlapping with the gate electrode on the gate insulating layer covering the gate line and the gate electrode;
    a source electrode formed on the gate insulating layer, branching from the data line and contacting one side of the semiconductor layer; and
    a drain electrode contacting the other side of the semiconductor layer, and facing with the source electrode.

4. A manufacturing method of a high light transmittance in-plane switching liquid crystal display device, the method comprising:
    a first mask process for forming gate elements by depositing and patterning a gate metal on a substrate;
    a second mask process for completing a thin film transistor by depositing a gate insulating layer, a semiconductor material and a source-drain metal sequentially, and by patterning the semiconductor material and the source-drain metal to form source-drain elements;
    a third mask process for forming a pixel electrode connecting the thin film transistor and a common electrode disposed in parallel with the pixel electrode having a predetermined distance by depositing and patterning a transparent conductive material on the gate insulating layer; and
    a fourth mask process for forming a gate contact hole exposing some portions of the gate elements and a data contact hole exposing some portions of the source-drain elements by depositing and patterning a passivation layer on the whole surface of the substrate having the pixel electrode and the common electrode, and for forming a gate terminal and a data terminal filling in the gate contact hole and the data contact hole, respectively.

5. The method according to the claim 4, wherein the fourth mask process comprises:
   depositing and patterning a photo-resist on the passivation layer;
   forming the gate contact hole and the data contact hole using the patterned photo-resist;
   depositing a conductive material on the whole surface of the substrate having the patterned photo-resist, the gate contact hole and the data contact hole; and
   forming a gate terminal and the data terminal by removing the patterned photo-resist, for selectively removing the conductive material disposed on the photo-resist and for remaining the conductive mate g within the gate contact hole and the data contact hole.

6. The method according to the claim 4, wherein the gate elements in the first mask process comprise:
   a gate line;
   a gate electrode branching from the gate line;
   a gate pad formed at one end of the gate line; and
   a common line disposed in parallel with the gate line, and
   wherein the gate contact hole in the fourth mask process comprises:
   a gate pad contact hole exposing some portions of the gate pad through the passivation layer and the gate insulating layer; and
   a common contact hole exposing some portions of the common line through the passivation layer and the gate insulating layer, and exposing some portions of the common electrode through the passivation layer.

7. The method according to the claim 6, wherein the gate terminal in the fourth mask process comprises:
   a gate pad terminal filling in the gate pad contact hole and contacting the gate pad; and
   a common connecting terminal filling in the common contact hole and connecting some portions of the common line with some portions of the common electrode.

8. The method according to the claim 4, wherein the source-drain elements in the second mask process comprises:
   a data life crossing the gate line having the gate insulating layer therebetween;
   a data pad formed one end of the data line;
   a source electrode branching from the data line and overlapping with one side of the gate electrode; and
   a drain electrode overlapping with the other side of the gate electrode and facing with the source electrode,
   wherein the thin film transistor overlaps with the gate electrode on the gate insulating layer, and comprises a semiconductor layer connecting the source electrode and the drain electrode, and
   wherein the data contact hole n the fourth mask process comprises a data pad contact hole exposing some portions of the data pad through the passivation layer.

9. The method according to the claim 8, wherein the data terminal in it fourth mask process comprises a data pad terminal filling in the data pad contact hole and connecting the data pad.

10. The device according to the claim 4, wherein the predetermined distance between the pixel electrode and the common electrode is 0.5~1.5 times of at least one width of the pixel electrode and the common electrode.

* * * * *